United States Patent [19]
Farnworth et al.

[11] Patent Number: 5,796,264
[45] Date of Patent: Aug. 18, 1998

[54] APPARATUS FOR MANUFACTURING KNOWN GOOD SEMICONDUCTOR DICE

[75] Inventors: Warren Farnworth, Nampa; Alan Wood, Boise, both of Id.

[73] Assignee: Micron Technology, Inc., Boise, Id.

[21] Appl. No.: 823,468

[22] Filed: Mar. 19, 1997

Related U.S. Application Data

[63] Continuation of Ser. No. 338,345, Nov. 14, 1994, Pat. No. 5,634,267, which is a continuation-in-part of Ser. No. 73,005, Jun. 7, 1993, Pat. No. 5,408,190, which is a continuation-in-part of Ser. No. 709,858, Jun. 4, 1991, abandoned, Ser. No. 788,065, Nov. 5, 1991, Pat. No. 5,440,240, and Ser. No. 981,956, Nov. 24, 1992, Pat. No. 5,539,324.

[51] Int. Cl.$^6$ ............................................. G01R 31/02
[52] U.S. Cl. .................................................... 324/758
[58] Field of Search ........................... 324/758, 754, 324/762, 755, 765

[56] References Cited

U.S. PATENT DOCUMENTS

| | | | |
|---|---|---|---|
| 4,899,921 | 2/1990 | Bendat et al. | 228/105 |
| 5,059,559 | 10/1991 | Takahashi et al. | 228/105 |
| 5,088,190 | 2/1992 | Malhi et al. | 29/843 |
| 5,123,850 | 6/1992 | Elder et al. | 439/67 |
| 5,212,880 | 5/1993 | Nishiguchi et al. | 29/739 |
| 5,408,190 | 4/1995 | Wood et al. | 324/765 |
| 5,416,592 | 5/1995 | Mori et al. | 356/399 |
| 5,519,332 | 5/1996 | Wood et al. | 324/755 |
| 5,536,974 | 7/1996 | Nishiguchi | 257/778 |
| 5,640,199 | 6/1997 | Garakani et al. | 348/87 |

*Primary Examiner*—Ernest F. Karlsen
*Assistant Examiner*—Anh Phung
*Attorney, Agent, or Firm*—Stephen A. Gratton

[57] ABSTRACT

A method and apparatus for fabricating known good semiconductor dice are provided. The method includes the steps of: testing the gross functionality of dice contained on a semiconductor wafer; sawing the wafer to singulate a die; and then testing the die by assembly in a carrier having an interconnect adapted to establish electrical communication between the bond pads on the die and external test circuitry. The interconnect for the carrier can be formed using different contact technologies including: thick film contact members on a rigid substrate; self-limiting contact members on a silicon substrate; or microbump contact members with a textured surface. During assembly of the carrier, the die and interconnect are optically aligned and placed into contact with a predetermined contact force. This establishes an electrical connection between the contact members on the interconnect and the bond pads of the die. In the assembled carrier the die and interconnect are biased together by a force distribution mechanism that includes a bridge clamp, a pressure plate and a spring clip. Following testing of the die, the carrier is disassembled and the tested die is removed.

18 Claims, 7 Drawing Sheets

APPARATUS FOR MANUFACTURING KNOWN GOOD SEMICONDUCTOR DICE

CROSS REFERENCE TO RELATED APPLICATIONS

This application is a continuation of application Ser. No. 08/338,345 filed Nov. 14, 1994 , now U.S. Pat. No. 5,634,267 which is a continuation-in-part of application Ser. No. 08/073,005 filed Jun. 7, 1993 now U.S. Pat. No. 5,408,190, which is a continuation-in-part of applications Ser. Nos. 07/709,858 filed Jun. 4, 1991, abandoned; 07/788,065 filed Nov. 5, 1991 now U.S. Pat. No. 5,440,240; and, 07/981,956 filed Nov. 24, 1992 now U.S. Pat. No. 5,539,324.

This application is related to copending applications Ser. Nos. 08/124,899 filed Sep. 21, 1993 now U.S. Pat. No. 5,495,179; 08/046,675 filed Apr. 14, 1993 now U.S. Pat. No. 5,367,253; 08/073,003 filed Jun. 7, 1993; 08/120,628 filed Sep. 13, 1993 now abandoned; 08/192,023 filed Feb. 3, 1994; 07/896,297 filed Jun. 10, 1992 now U.S. Pat. No. 5,424,652; 08/192,391 filed Feb. 3, 1994; and, 08/137,675 filed Oct. 14, 1993 now abandoned.

FIELD OF THE INVENTION

This invention relates to semiconductor manufacture and more particularly to a method and apparatus for manufacturing known good die.

BACKGROUND OF THE INVENTION

One of the fastest growing segments of the semiconductor industry is the manufacture of multi-chip modules (MCM). Multi-chip modules are being increasingly used in computers to form PC chip sets and in telecommunication items such as modems and cellular telephones. In addition, consumer electronic products such as watches and calculators typically include multi-chip modules.

With a multi-chip module, non-packaged or bare dice (i.e., chips) are secured to a substrate (e.g., printed circuit board) using an adhesive. Electrical connections are then made directly to the bond pads on each die and to electrical leads on the substrate. Non-packaged dice are favored because the costs associated with manufacturing and packaging the dice are substantially reduced. This is because the processes for packaging semiconductor dice are extremely complex and costly.

Figure 1:
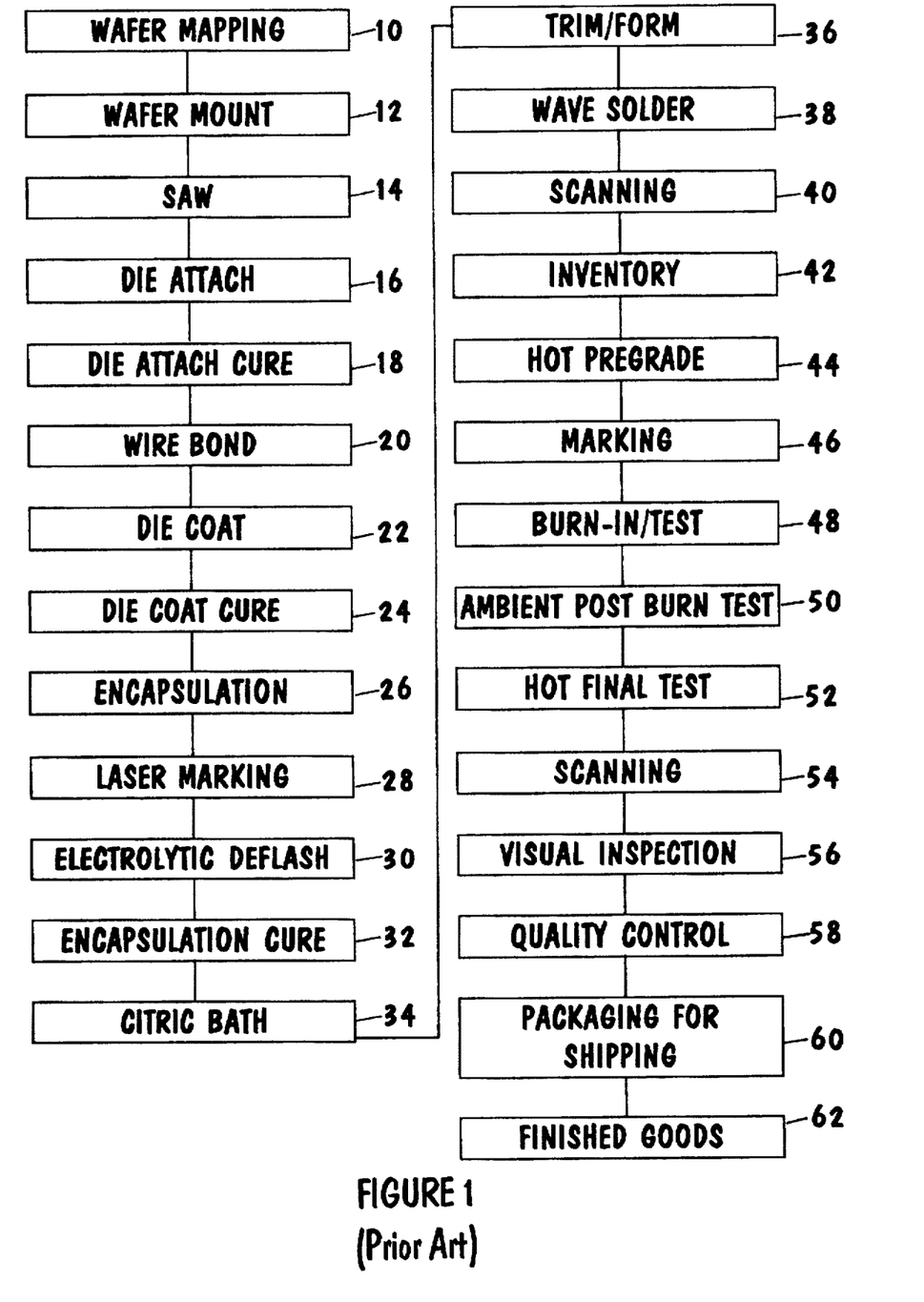
FIG. 1 is a block diagram illustrating a prior art semiconductor manufacturing process for manufacturing packaged die.

This is illustrated with reference to FIG. 1. A fabrication process for a packaged die begins with a semiconductor wafer on which a large number of semiconductor dice have been formed by doping, masking, deposition of metals, and etching a silicon substrate. Initially the wafer is probed and mapped, step 10. Wafer mapping is performed to test the gross functionality of the dice on the wafer. The nonfunctional dice are mechanically marked or mapped in software. Next, the mapped wafer is mounted on a carrying film, step 12. The carrying film allows the wafer to be mechanically transported and provides support for the saw cutting procedure.

Next, the dice are singulated using a diamond saw, step 14. Each singulated die must then be attached to a metal lead frame, step 16. A single lead frame supports several semiconductor dice for packaging and provides the leads for the packaged die. Die attach to the lead frame is typically accomplished using a liquid epoxy adhesive that must be cured with heat, step 18. Next, a wire bond process, step 20, is performed to attach thin bond wires to the bond pads on the die and to the lead fingers of the lead frame. A protective coating such as a polyimide film is then applied to the wire bonded die, step 22, and this coating is cured, step 24.

The semiconductor die is then encapsulated using an epoxy molding process, step 26. Alternately premade ceramic packages with a ceramic lid may be used to package the die. Next, the encapsulated die is laser marked for identification, step 28. This is followed by an electrolytic deflash for removing excess encapsulating material, step 30, an encapsulation cure, step 32 and cleaning with a citric bath, step 34. Next, the lead frame is trimmed and formed, step 36, to form the leads of the package, and the leads are plated using a wave solder process (tin or plating), step 38. This is followed by scanning, step 40, in which the packaged dice are optically scanned for defects and then an inventory, step 42.

The packaged die is then subjected to a hot pregrade test, step 44 in which it is tested and then marked, step 46. A series of burn-in tests, steps 48 and 50, and a hot final test, step 52 are then performed to complete the testing procedure. This is followed by another scan, step 54, a visual inspection, step 56, a quality control check, step 58, and packaging for shipping, step 60. The finished goods are represented at step 62.

As is apparent, the packaging process (steps 16–40) for manufacturing packaged dice requires a large amount of time, materials and capital investment to accomplish. Thus one advantage of manufacturing bare or unpackaged dice is that the above manufacturing process can be greatly simplified because all of the packaging steps are eliminated. A disadvantage of manufacturing unpackaged dice is that transport and testing of the dice is more difficult to accomplish.

With unpackaged dice, semiconductor manufacturers are required to supply dice that have been tested and certified as known good die (KGD). Known-good-die (KGD) is a collective term that connotes unpackaged die having the same quality and reliability as the equivalent packaged product. This has led to a need in the art for manufacturing processes suitable for fabricating and testing bare or unpackaged semiconductor die.

For test and burn-in of bare die, a carrier must replace a conventional single chip package in the manufacturing process. The carrier includes an interconnect that allows a temporary electrical connection to be made between external test circuitry and the bond pads of the die. In addition, such a carrier must be compatible with semiconductor manufacturing equipment and allow the necessary test procedures to be performed without damaging the die. The bond pads on a die are particularly susceptible to damage during the test procedure.

In response to the need for unpackaged die, different semiconductor manufacturers have developed carriers for testing known good die. As an example, carriers for testing unpackaged die are disclosed in U.S. Pat. No. 4,899,107 to Corbett et al. and U.S. Pat. No. 5,302,891 to Wood et al., which are assigned to Micron Technology, Inc. Other carriers for unpackaged die are disclosed in U.S. Pat. No. 5,123,850 to Elder et al., and U.S. Pat. No. 5,073,117 to Malhi et al., which are assigned to Texas Instruments.

One of the key design considerations for a carrier is the method for establishing electrical communication between the die and interconnect. With some carriers, the die is placed face down in the carrier and biased into contact with the interconnect. The interconnect includes contacts that physically align with and contact the bond pads or test pads of the die. Exemplary contact structures include wires, needles, and bumps. The mechanisms for making electrical contact include piercing the native oxide of the bond pad with a sharp point, breaking or burnishing the native oxide with a bump, or moving across the native oxide with a contact adapted to scrub away the oxide. In general, each of these contact structures is adapted to form a low-resistance "ohmic contact" with the bond pad. Low-resistance is a negligible resistance. An ohmic contact is one in which the voltage appearing across the contact is proportional to the current flowing for both directions of current flow. Other design considerations for a carrier include electrical performance over a wide temperature range, thermal management, power and signal distribution, and the cost and reusability of the carrier.

The present invention is directed to a method for manufacturing known good die. In addition, the present invention is directed to an apparatus for manufacturing known good die including carriers for testing bare die and apparatus for automatically loading and unloading bare die into the carriers.

OBJECTS OF THE INVENTION

Accordingly, it is an object of the present invention to provide an improved method for manufacturing known good die.

It is yet another object of the present invention to provide improved apparatus for manufacturing known good die.

It is a further object of the present invention to provide an improved method for manufacturing known good die utilizing carriers adapted to test and burn-in a bare, unpackaged die without damage to the die.

It is a still further object of the invention to provide a method for manufacturing known good die utilizing carriers that are reusable and easy to assemble, that provide a reliable electrical connection with contact locations on a die over a wide temperature range, and that can be easily adapted to testing of different types of dice.

It is a still further object of the present invention to provide a method and apparatus for manufacturing known good die that are efficient, reliable and suitable for large scale semiconductor manufacture.

Other objects, advantages and capabilities of the present invention will become more apparent as the description proceeds.

SUMMARY OF THE INVENTION

In accordance with the present invention, a method and apparatus for manufacturing known good die are provided. The method of the invention, generally stated, includes the steps of: fabricating a semiconductor wafer containing a plurality of dice; testing the gross functionality of the dice and mapping the wafer; sawing the wafer into discrete die; assembling each discrete die in a carrier having an interconnect and a force distribution mechanism adapted to bias the die and interconnect together; testing the die using the carrier and recording the test data; disassembling the carrier to remove the tested die; and then continuing processing of the tested die for shipment.

The carrier is adapted to retain the die under test and provide a temporary electrical connection between the die and external test circuitry. This enables burn-in and other test procedures to be performed on the die. The carrier includes a carrier base with external connectors and an interconnect for establishing temporary electrical communication between the die and the external connectors.

In addition to the base and temporary interconnect, the carrier includes a force distribution mechanism for retaining and biasing the die and the interconnect together. The force distribution mechanism includes a bridge clamp, a spring clip and a pressure plate. The carrier base, interconnect and force distribution mechanism are designed for efficient assembly and disassembly of the carrier with a die.

The temporary interconnect is formed in a configuration which accommodates a particular die bondpad configuration (e.g., peripheral, array, edge connect, end connect, lead over chip (LOC)) and bondpad structure (e.g., flat pad, solder ball, bumped pad). Different types of interconnects are thus interchangeable to allow testing of the different types of semiconductor dice using a universal carrier. The interconnect includes raised contact members for contacting contact locations (e.g., bond pads, test pads) on the die to form an electrical connection. The contact members are shaped to accommodate flat or raised (e.g., bumped pad) contact locations on the die. Electrical communication between the contact members on the interconnect and the external connectors on the carrier base is provided by conductive traces on the interconnect. The conductive traces are electrically attached to the external connectors on the carrier using wire bonding or a mechanical connection.

Different contact technologies may be employed to form the interconnect. As an example, the interconnect may be formed with a rigid electrically non-conductive substrate (e.g., ceramic, silicon) and thick film contact members formed using an ultrasonic forging process. Alternately the interconnect may formed with silicon substrate and raised silicon contact members having oxide-penetrating blades. The interconnect may also be formed with microbump contact members mounted on a rigid substrate. The microbump contact members can be plated with an oxide penetrating textured metal layer.

During assembly of the carrier and die, the interconnect is placed in the carrier and the die is attached to the pressure plate of the force distribution mechanism using a vacuum. The die and interconnect are optically aligned using a vision system. The die is then placed into contact with the interconnect with a predetermined force so that the contact members on the interconnect form an electrical connection with the contact locations on the die. At the same time the bridge clamp of the force distribution mechanism is attached to the carrier for biasing the die and interconnect together to maintain the electrical connections. The assembled carrier is then tested using suitable burn-in test equipment. Following the test procedure, the carrier is disassembled and the tested die is removed.

This assembly procedure may be performed manually using an optical alignment system similar to an aligner bonder used for flip chip bonding. Alternately an apparatus for automatically assembling and disassembling the carrier can be provided. The automated assembly/disassembly apparatus includes a pick and place system for picking a die from a mapped, saw-cut wafer; a vision alignment system for aligning the die and interconnect; and a robot, responsive to the vision alignment system, that attaches the die to the force distribution mechanism and then attaches the force distribution mechanism to the carrier base. Each carrier is marked with a bar code so that a die can be tracked through the assembly and testing procedures.

BRIEF DESCRIPTION OF THE DRAWINGS

FIGS. 6–6B are cross sectional views of alternate embodiment interconnects formed with microbump contact members;

FIG. 7 is a schematic diagram illustrating an assembly procedure for aligning the die and interconnect;

DETAILED DESCRIPTION OF THE PREFERRED EMBODIMENT

Figure 2:
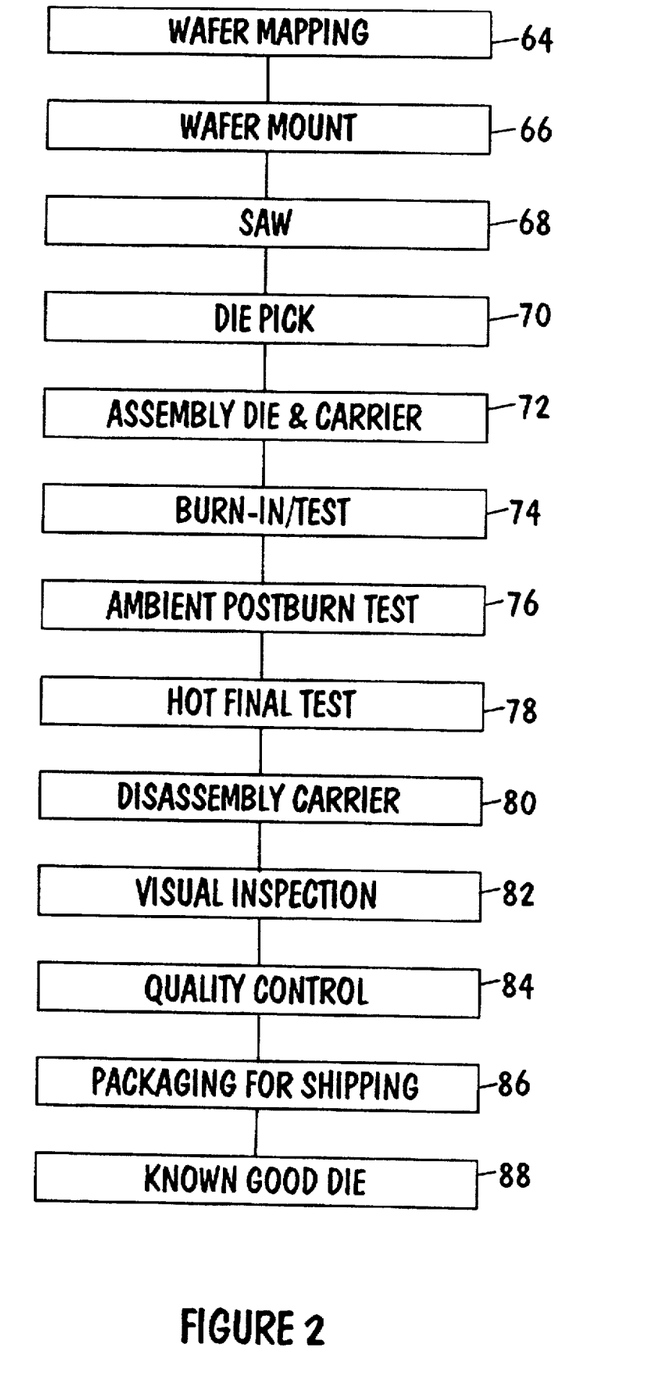
FIG. 2 is a block diagram illustrating the method of the invention for manufacturing known good die.

Referring now to FIG. 2, the method of the invention is illustrated in a flow diagram. During the semiconductor manufacturing process a semiconductor wafer is fabricated with a large number of dice. The wafer is formed by patterning and doping a semiconducting substrate and then depositing, patterning and etching various layers of material on the substrate to form integrated circuits. Initially, the wafer is subjected to probe testing to ascertain the gross functionality of the dice contained on the wafer. Each die is given a brief test for functionality, and the nonfunctional die are mechanically marked or mapped in software, step 64. Wafer probe includes various functional and parametric tests of each die. Test patterns, timing voltage margins, limits and test sequence are determined by individual product yields and reliability data.

Four testing levels (C1, C2, C3, C7) have been established for semiconductor die. Standard probe (C1) level includes the standard test for gross functionality. Speed probe (C2) level tests the speed performance of a die for the fastest speed grades. Burned-in die (C3) level includes a burn-in test. Known good die (C7) level involves testing to provide a quality and reliability equal to package products. During the wafer mapping, step 64, the dice are tested to the (C1) or (C2) level.

Following the wafer mapping step 64, the wafer containing the dice is mounted on a flexible carrier film, step 66. The carrier film is covered with an adhesive material for retaining and supporting the wafer for transport and sawing. The wafer is then sawed utilizing a diamond-tipped saw, step 68, which separates the dice along predetermined scribe lines. This singulates the dice formerly contained on the wafer into discrete bare dice.

Next, the bare dice having an acceptable gross functionality are picked up one at a time utilizing a suitable manual or automated method, step 70. With a manual method, an operator picks up the dice one at a time using a vacuum wand and places each die in a sectioned plate, boat or other holding apparatus for transfer to the next operation. With an automated method of die pick, information gained during the wafer probe is used to direct an automated wand to the mapped dice.

Figure 3:
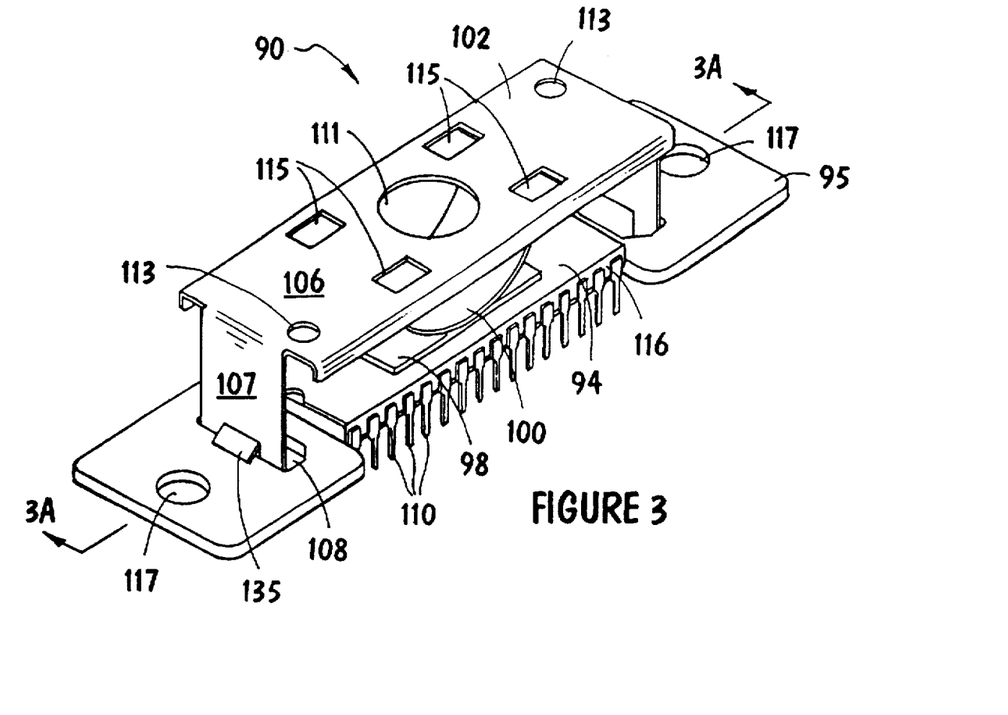
FIG. 3 is a perspective view of a carrier suitable for manufacturing known good die in accordance with the method of the invention.
Figure 3A:
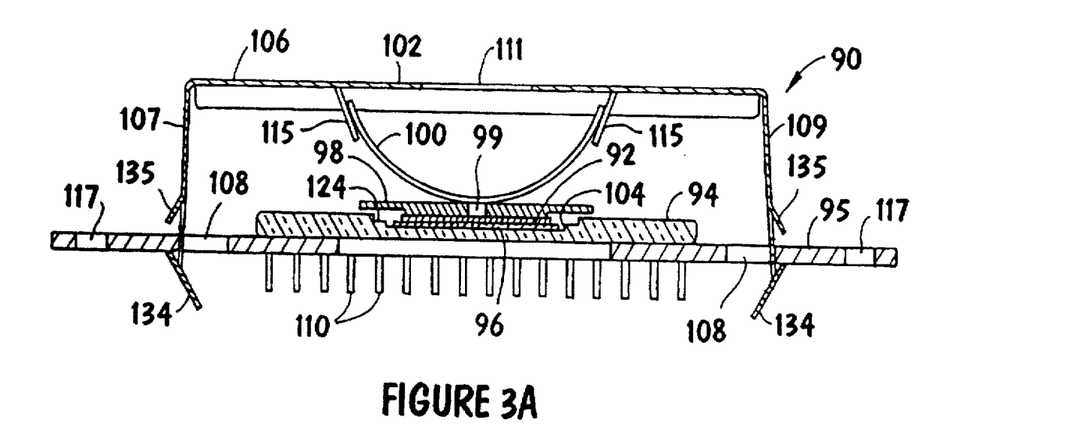
FIG. 3A is a cross sectional view taken along section line 3A—3A of FIG. 3.

Next, each bare die to be tested is assembled into a carrier, step 72. A carrier 90 suitable for practicing the method of the invention is shown in FIGS. 3 and 3A. The carrier 90 is adapted to retain a die 92 and establish an electrical connection between the die 92 and external test circuitry. The assembly and function of the carrier 90 will be explained as the description proceeds.

Returning to FIG. 2, following assembly of the die 92 within the carrier 90 (FIG. 3), the die 92 is subjected to burn-in testing (C3 level), step 74. During burn-in testing, the carrier 90 and bare die 92 are placed in a burn-in oven and subjected to temperature cycling (e.g., $-55°$ C. to $150°$ C.) for a time period of from several minutes to several hours or more. At the same time, the integrated circuits on the die 92 are placed under an electrical bias. The burn-in test is intended to drive contaminants into the active circuitry and detect early failures.

Following the burn-in test, an ambient postburn test, step 76, and a hot final test, step 78, are conducted on the bare die 92 while it is still held within the carrier 90. These tests are intended to further test and quantify electrical characteristics of the bare die 92 and to certify the die 92 as a known good die (C7 level).

Next, the carrier 90 (FIG. 3) is disassembled and the die 92 is removed from the carrier, step 80. As will be further explained, the carrier 90 is designed to be assembled and disassembled either manually or automatically without damaging the die 92. Following the disassembly, the tested die 92 may be placed in a tray or other holder and subjected to a visual inspection, step 82, a quality control check, step 84, and packaging for shipping (e.g., wrapping, boxing, etc.), step 86. The known good die are represented at 88.

Carrier

Referring now to FIGS. 3 and 3A, details of a carrier 90 suitable for practicing the method of the invention are shown. FIGS. 3 and 3A illustrate the carrier 90 assembled for testing a bare die. The carrier 90 includes:

- a carrier base 94 adapted to retain the die 92 for testing;
- an interconnect 96 adapted to establish a temporary electrical connection between the die 92 and external connectors 110 on the carrier base 94;
- a force distribution mechanism comprising a pressure plate 98, a bridge clamp 102 and a spring clip 100 for retaining the die 92 in the carrier base 94, and for biasing the interconnect 96 against the die 92; and
- a carrier tray 95 adapted to support the carrier base 94 for handling.

The carrier base 94 is a generally rectangular shaped, block-like structure, formed of an insulative, heat-resistant, material such as a ceramic or a high temperature molded plastic. The carrier base 94 includes a cavity 104 that is sized and shaped to retain the interconnect 96.

The carrier base 94 is formed with an arrangement of external connectors 110 along each longitudinal edge 116. The connectors 110 are adapted for connection to external test circuitry using a test socket (not shown) or other arrangement. The connectors 110 are arranged in the configuration of the external leads of a dual in-line package (DIP). This arrangement, however, is merely exemplary as other lead configurations such as leadless chip carrier (LCC) are also possible. As will be further explained, an electrical pathway is established between the connectors 110 and the interconnect 96 by wire bonding.

In the assembled carrier shown in FIGS. 3 and 3A, the carrier base 94 is removably secured to the carrier tray 95 using an adhesive. The bridge clamp 102 functions to bias the pressure plate 98 and die 92 against the interconnect 96 held within the carrier base 94. The carrier base 94 and carrier tray 95 may also include some type of aligning or interlocking arrangement (not shown) to facilitate the assembly of these components.

As shown in FIG. 3A, the bridge clamp 102 is a generally u-shaped structure that includes a top portion 106 and sides 107, 109. As shown in FIG. 3, the top portion 106 of the bridge clamp 102 includes various apertures including a central aperture 111, and lateral apertures 113. As will be more fully explained, the apertures 111, 113 facilitate handling during assembly and disassembly of the carrier 90.

The bridge clamp 102 is formed of a naturally resilient, elastically deformable material such as steel. The sides 107, 109 of the bridge clamp 102 are formed with tab members 134. The tab members 134 are adapted to be placed through slots 108 in the carrier tray 95 to abut the underside of the carrier tray 95. The spacing of the sides 107, 109 of the bridge clamp 102 and slots 108 in the carrier tray 95 is such that in the assembled carrier 90 a lateral force is generated by the sides 107, 109 for biasing the tabs 134 against the carrier tray 95. Conversely, by pressing inwardly on the sides 107, 109, the tabs 134 can be moved towards one another for disengaging the bridge clamp 102 from the carrier tray 95. Another set of tabs 135 formed on the sides 107, 109 of the bridge clamp 102 limit the downward axial movement of the bridge clamp 102.

The top portion 106 of the bridge clamp 102 also includes four downwardly extending tabs 115 for retaining the spring clip 100 or for attaching the spring clip 100 by welding or other suitable process. The spring clip 100 is formed of a material such as spring steel. In the assembled carrier 90, the bridge clamp 102, spring clip 100 and pressure plate 98 function as a force distribution mechanism for exerting and evenly distributing a biasing force against the die 92 and interconnect 96. Furthermore, the size, shape and mounting of the bridge clamp 102 and spring clip 100 are selected to achieve a biasing force of a desired magnitude. The spring clip 100 includes a central aperture (not shown). As will be more fully explained, the central aperture permits an assembly wand (144 FIG. 7) to be placed through the spring clip 100 for assembling the carrier 90.

The pressure plate 98 is a generally rectangular shaped plate formed of a material such as metal. The outer perimeter of the pressure plate is slightly larger than that of the die 92 and interconnect 96. As shown in FIG. 3A, the pressure plate 98 includes an opening 99. As will be further explained, during assembly of the carrier 90, the opening 99 is used as a conduit for a vacuum to facilitate assembly of the carrier 90. Briefly, during the assembly procedure, the die 92 is attached to the pressure plate 98, and the die 92 and interconnect 96 are aligned using optical alignment techniques. The pressure plate and die 92 are then lowered to place the die 92 into contact with the interconnect 96. At the same time the bridge clamp 102 is secured to the carrier tray 95 for securing the assembly and biasing the die 92 and interconnect 96.

In the assembled carrier 90, the carrier base 94 attaches to the carrier tray 95 substantially as shown in FIG. 3A. The carrier tray 95 is a flat metal plate. The carrier tray includes a pair of through openings 117. The placement of the openings 117, along with the thickness and shape of the carrier tray 95, is adapted to facilitate handling by automated equipment such as magazine loaders, indexing apparatus and robotic arms.

Interconnect

The interconnect 96 is fabricated in a configuration to accommodate a particular die bond pad configuration. Different configurations of interconnects are interchangeable within the carrier 90. This permits the different types of dice (e.g., edge connect, end connect, array, peripheral, lead over chip) to be tested using a "universal carrier". A carrier thus need not be dedicated to a particular die configuration.

Figures 4, 4A, 4B:
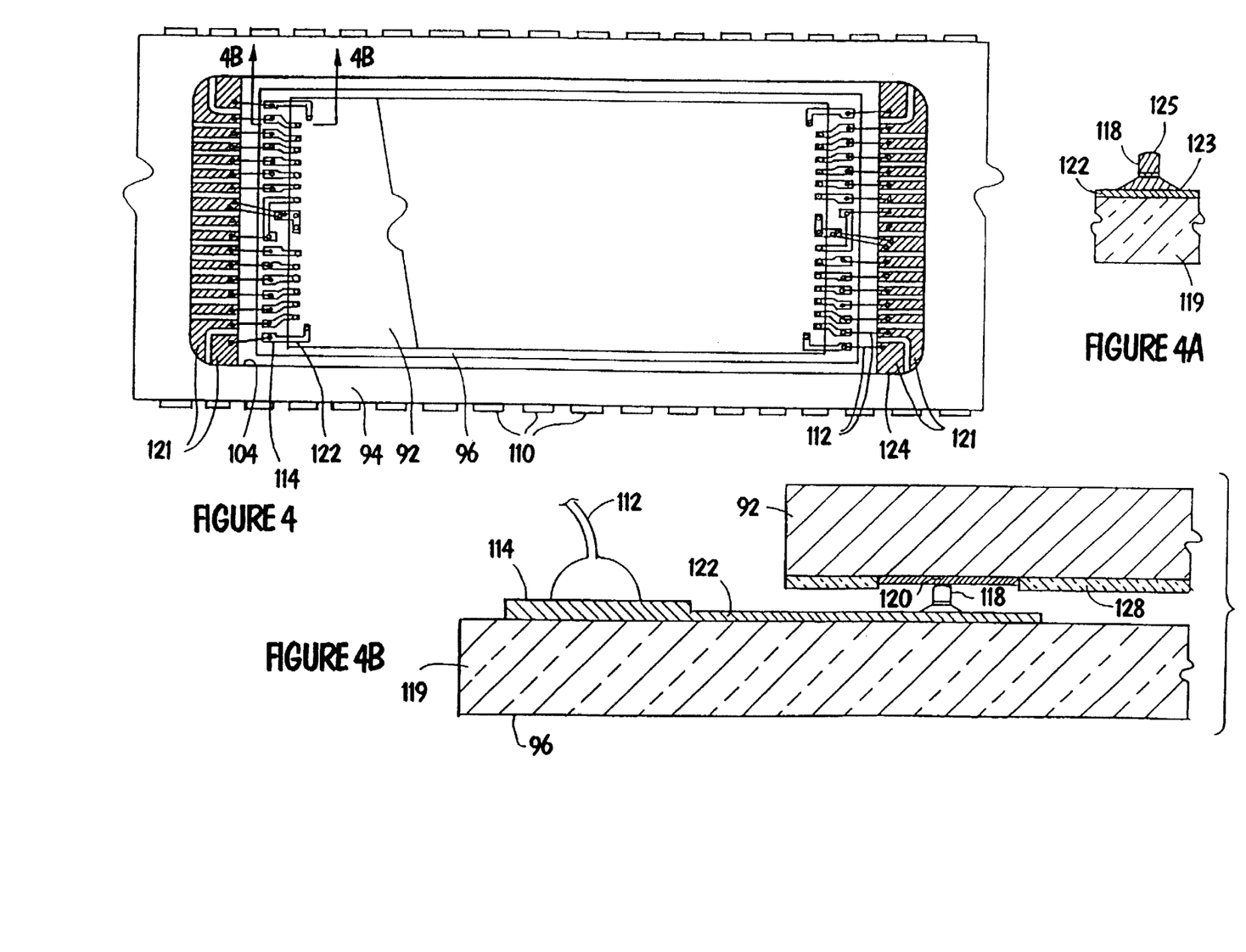
FIG. 4 is a plan view showing an interconnect for the carrier of FIG. 3 and illustrating the wire bonding between the interconnect and carrier.
FIG. 4A is a cross section showing a contact member for the interconnect of FIG. 4.
FIG. 4B is a cross section taken along section line 4B—4B of FIG. 4 showing the contact member in contact with a bond pad of a semiconductor die.
Figures 5, 5A:
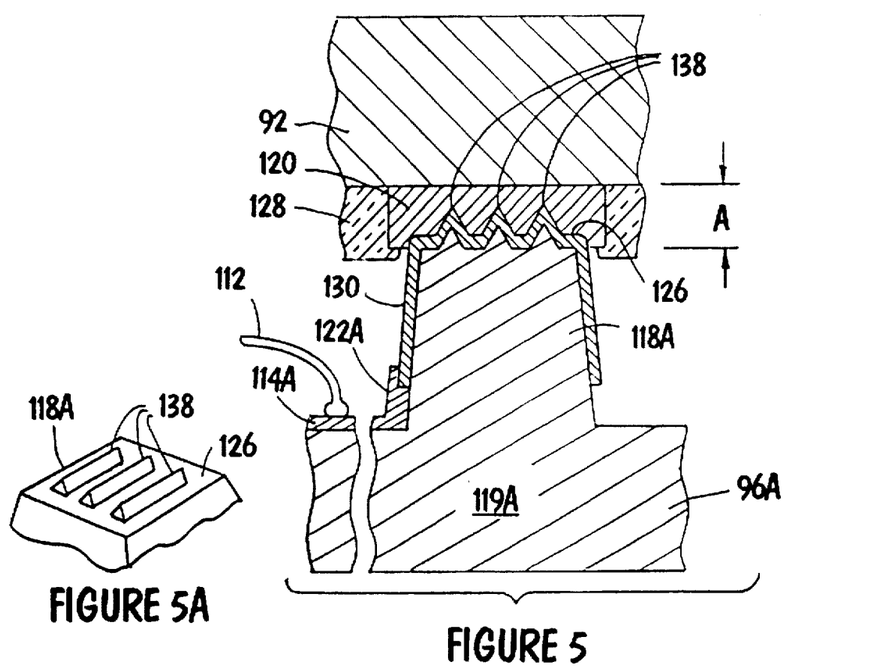
FIG. 5 is a cross sectional view of an interconnect having a raised contact member formed of silicon shown engaging a die and illustrating the self limiting raised portions of the contact member.
FIG. 5A is an enlarged portion of the raised silicon contact member shown in FIG. 5 and showing the oxide penetrating raised portions of the contact members.
Figure 5B:
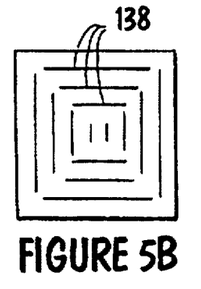
FIGS. 5B–5G are plan views illustrating different layouts of raised portions for forming contact members.
Figure 5C:
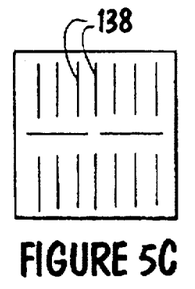
Figure 5D:
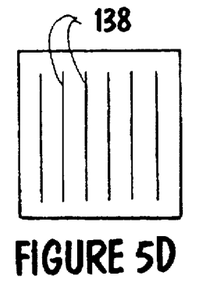
Figure 5E:
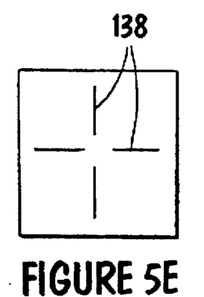
Figure 5F:
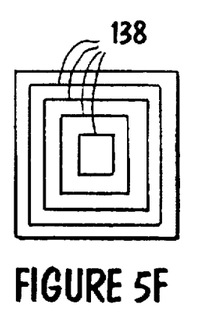
Figure 5G:
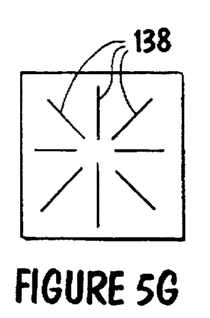
Figures 6, 6A, 6B, 7:
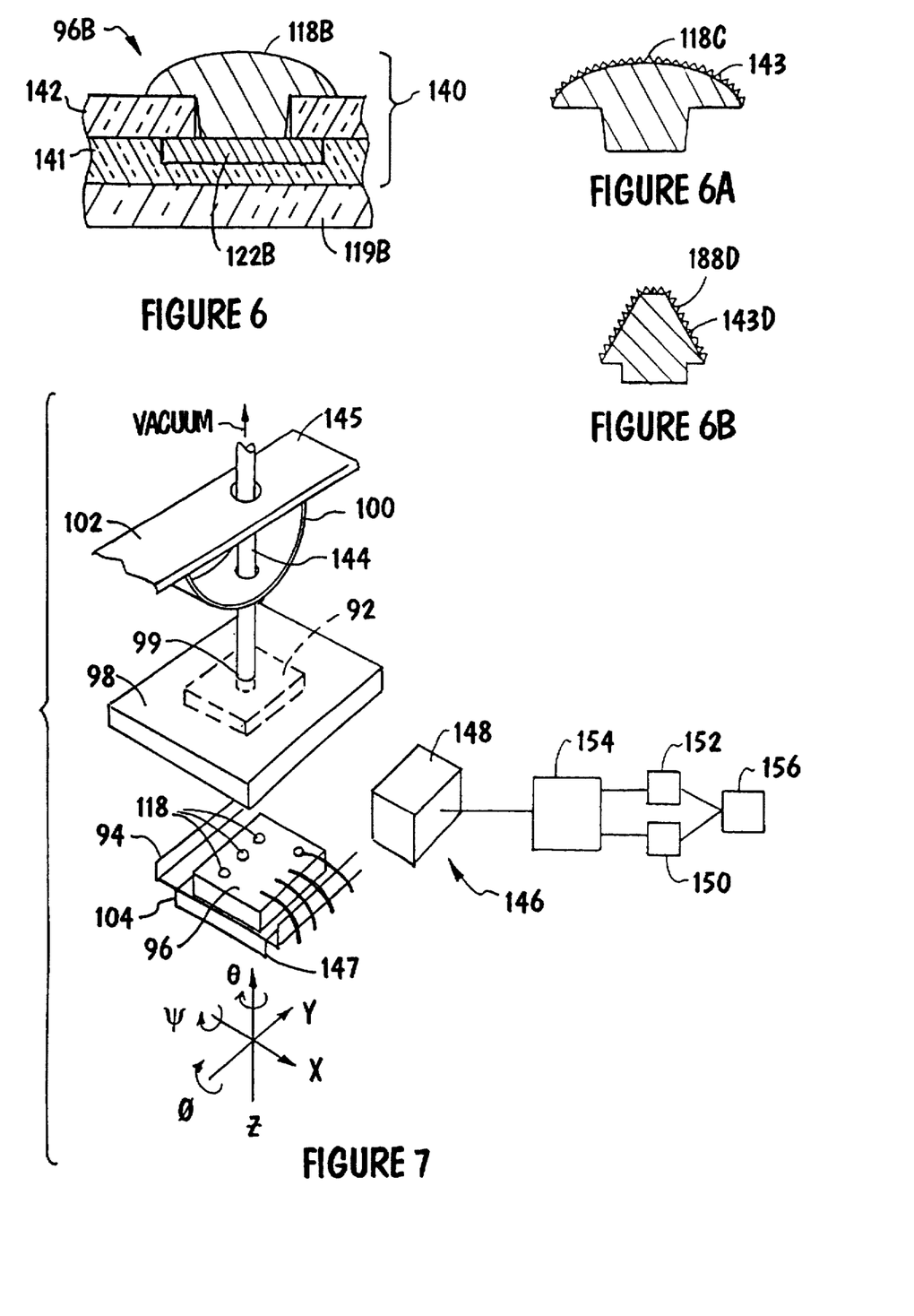

Three different contact technologies for establishing a temporary electrical connection between the interconnect 96 and contact locations on the semiconductor die 92 are shown in FIGS. 4–6. In a first embodiment of the interconnect, shown in FIGS. 4–4B, the interconnect 96 includes a rigid electrically non-conductive substrate 119 with thick film contact members 118 formed by an ultrasonic forging process. In a second embodiment of the interconnect, shown in FIGS. 5–5G, the interconnect 96A includes silicon substrate 119A having raised contact members 118A formed with a self limiting feature. In a third embodiment of the interconnect, shown in FIG. 6, the interconnect 96B includes a rigid substrate 119B with thin film microbump contact members 118B attached thereto.

An electrical pathway is established between the interconnect 96, 96A or 96B and the external leads 110 on the carrier base 94 by wire bonding. In place of wire bonding, other electrical pathways, such as mechanical connectors, may be employed.

FIG. 4 shows the interconnect 96 mounted within the carrier base 94 and with the die 92 superimposed. The interconnect 96 is rectangular in shape and is slightly larger than a rectangular shaped bare die 92. The interconnect 96 includes the rigid substrate 119 and contact members 118 for contacting the bond pads 120 (or other contact locations) on the die 92. The rigid substrate is preferably formed of a material such as ceramic or silicon having a coefficient of thermal expansion which is similar to that of a silicon die 90. The interconnect 96 also includes conductive traces 122 formed on the substrate 119 in electrical communication with the contact members 118. The conductive traces 122 include (or are connected to) bonding sites 114 for wire bonding the conductive traces 122 to bonding sites 121 on the carrier base 94. The bonding sites 121 on the carrier base 94 are in electrical communication with the external leads 110 of the carrier base 94.

The contact members 118 on the interconnect 96, are spaced in a pattern that corresponds to the size and placement of the bond pads 120 (FIG. 5) on the bare die 92. The interconnect 96 shown in FIG. 4 is for a die 92 formed with bond pads 120 along each end (i.e., end connect). However, as previously stated, other interconnect configurations may be provided for other die bond pad configurations.

As shown in FIG. 4A, each contact member 118 is formed with a conical base 123 in contact with the conductive trace 122 and a tip 125 adapted to penetrate into the bond pad 120. FIG. 4B illustrates the die 92 and interconnect 96 in contact in the assembled carrier 90. As shown in FIG. 4B, the bond pad 120 is embedded in a protective layer 128 formed on the die 92. In addition a thin oxide coating (not shown) is formed on the bond pad 120. The contact member 118 must pierce this oxide coating to establish an electrical connection or ohmic contact with the bond pad 120.

The contact members 118 are thick film contacts. One suitable process for forming thick filmed contacts is ultrasonic forging. U.S. Pat. No. 5,249,450, entitled Probehead For Ultrasonic Forging, incorporated herein by reference, describes an ultrasonic forging process with a specially shaped forge head suitable for forming the contact members 118.

The contact members 118 are formed on the substrate in electrical communication with the conductive traces 122. The conductive traces 122 may be formed utilizing a metallization process in which a metal is blanket deposited, photopatterned and etched. The conductive traces 122 may be formed of a conductive metal such as aluminum, copper, or a refractory metal or of a conductive material such as polysilicon. Each conductive trace 122 includes (or is attached to) a bonding site 114 for wire bonding to a corresponding bonding site 121 (FIG. 4) on the carrier base 94. A suitable pad metallurgy may be utilized for forming the bonding sites 114 and 121.

The bonding sites 121 on the carrier base 94 are attached to circuit traces (not shown) in electrical communication with the external connectors 110 of the carrier base 94. Thin bond wires 112 are wire bonded to the bonding sites 114 on the interconnect 96 and to the bonding sites 121 on the carrier base 94 using techniques that are known in the art. The carrier base 94 is formed with a stepped bond shelf 124 that facilitates the wire bonding process.

Referring now to FIGS. 5–5G, the interconnect 96A having a silicon substrate 119A and raised contact members 118A is shown. The raised contact members 118A are formed with a self limiting feature that limits a penetration depth of the contact members 118A into the bond pads 120 on the bare die 92.

As shown in FIGS. 5 and 5A, each contact member 118A is formed as a raised mesa or pillar that projects vertically upward from a surface of the silicon substrate 119A. In addition, each contact member 118A includes one or more raised projections 138 which extend from a top surface 126 of the contact member 118. As shown in FIG. 5A, the raised projections 138 can be formed as knife edges. The raised projections 138 are adapted to penetrate into the bond pads 120 of the bare die 92. At the same time the top surface 126 of the contact member 118A limits a penetration depth of the raised projections 138 into the bond pad 120. The height of the raised projections 138 is selected to be less than the depth "A" of a bond pad 120 (e.g., height=⅕ to ⅘ of A). This arrangement permits an oxide layer of the bond pad 120 to be pierced and an electrical connection to be established while at the same time the damage to the bond pad 120 is limited.

One suitable process for forming the contact members 118A as pillars having raised projections is disclosed in U.S. Pat. No. 5,326,428 entitled Method For Testing Semiconductor Circuitry For Operability And Method Of Forming Apparatus For Testing Semiconductor Circuitry For Operability, which is incorporated herein by reference.

The contact members 118A of the interconnect 96A include conductive tips 130. Each conductive tip 130 is connected to a conductive trace 122A formed on the silicon substrate 119A. The conductive traces 122A include a bonding site 114A for wire bonding thin bond wires 112 substantially as previously described.

FIGS. 5B–5G illustrate various layouts for the raised projections 138 of the contact members 118A. Layout 5B is a symmetrical pattern in which the raised projections 138 are formed with decreasing lengths as a center of the contact member 118A is approached. Layout 5C includes raised projections 138 in a parallel spaced array with one pair of orthogonally oriented projections 138. Layout 5D is an array of parallel spaced projections 138. Layout 5E is a t-shaped array of projections 138. Layout 5F is an arrangement of projections 138 formed as concentric squares. Layout 5G is an array of equally angularly disposed projections 138.

Although the raised projections 138 are illustrated on raised contact members 118A, the projections 138 can also be formed directly on the silicon substrate 119A. In that case, the conductive traces 122A would attach directly to the projections 138. A top surface of the silicon substrate 119A would provide a stop plane for limiting a penetration depth of the projections 138.

Referring now to FIG. 6, a third embodiment of the interconnect is shown. In the third embodiment, the interconnect 96B includes a rigid substrate 119B having microbump contact members 118B. Microbump contact technology, which is used for Tape Automated Bonding (TAB), employs a nonconductive and electrically insulating tape (e.g., polyimide) having a metallic foil (e.g., Cu) attached thereto. The foil is patterned and etched to form conductive traces. Holes are etched through the tape in contact with the conductive traces. Metal bumps (e.g., Ni, Au, Solder, Cu) are formed in the holes in contact with the conductive traces. U.S. Pat. No. 4,899,207 discloses a method of tape automated bonding using thin film microbump contacts. Microbump contacts are commercially available from Nitto Denko America, Inc. and are sold under the tradename ASMAT™. Microbump contacts are also commercially available from Packard-Hughes Interconnect, Irvine, California and are sold under the trademark Gold Dot™.

For forming the interconnect 96B, a microbump assembly 140 is attached to a rigid substrate 119B. An adhesive 141 may be used to secure the microbump assembly 140 to the rigid substrate 119B. The rigid substrate 119B may be formed of a material such as silicon, silicon-on-sapphire, silicon-on-glass, germanium, metal or a ceramic. The microbump assembly 140 includes microbump contact members 118B formed on etched polyimide tape 142. The contact members 118B are formed with a hemispherical or convex shape and are adapted to contact and establish electrical communication with bond pads on the die 92. The contact members 118B are in electrical communication with conductive traces 122B attached to the polyimide tape 142. The conductive traces 122B include (or are attached to) bonding sites (not shown) for wire bonding the interconnect 96B to the carrier base 94 substantially as previously described.

With reference to FIG. 6A, a microbump contact member 118C can include a rough textured metal layer 143 to facilitate penetration of the oxide coating on the bondpad 120. The textured metal layer 143 is formed using an electrolytic deposition process in which process parameters are controlled to form a rough plating. The rough textured metal layer can also be formed by etching a smooth microbump. For a microbump contact member 118C having a diameter of about 30 μ the asperities of the textured metal layer 143 will include oxide penetrating asperities on the order of about 5000 Å or less. For a microbump contact member 118C formed of a material such as nickel, the plated material will be one such as molybdenum, tungsten, platinum, iridium or gold, which has a more positive electromotive potential than nickel. In certain applications the microbump contact member 118C can be nickel Besides the convex shaped microbump contact members 118C shown in FIG. 6A, microbump contact members can be formed in other shapes. FIG. 6B illustrates a microbump contact member 118D formed in a conical shape with a flat tip and having a rough metal layer 143D. Microbump contact members can also be formed to accommodate raised or bumped bond pads on a die. In that case, the contact members include an indentation for mating engagement with the raised or bumped bond pad.

Carrier Assembly/Disassembly

In use of the carrier 90, the interconnect 96 which is custom formed for the type of bare die 92 being tested, is wire bonded as shown in FIG. 4 to the carrier base 94. Wire bonding the interconnect 96 and carrier base 94 provides a semi-permanent electrical connection between these two components. Both the carrier base 94 and interconnect 96 can be reused in this configuration many times. At the same time, however, the bond wires 112 (FIG. 4) can be severed for replacing the interconnect 96 with a different interconnect for another type of die.

For assembling the carrier 90 with a bare die 92, the die 92 must be aligned and placed into contact with the interconnect 96 and the bridge clamp 102 secured to the carrier base 95. A technique for assembling the interconnect 96 with the die 92 is shown in FIG. 7. An assembly wand 144 connected to a vacuum source is used during the assembly procedure. Initially the die 92 is attached to the pressure plate 98 using a vacuum directed through the opening 99 in the pressure plate 98. The assembly wand 144 holds the pressure plate 98 and die 92 together and also holds the bridge clamp 102 so that it may be secured to the carrier base 94.

During the assembly procedure, the bond pads 120 (FIG. 4B) on the die 92 must be aligned with the contact members 118 on the interconnect 96. This can be accomplished using alignment techniques developed for flip chip bonding processes. Flip chip bonding refers to a process wherein a semiconductor die is placed face down on a substrate such as a printed circuit board and the bond pads on the die are bonded to connection points on the substrate. Tools for flip chip bonding are sometimes referred to as aligner bonders. An aligner bonder and method of optical alignment for flip chip bonding is described in U.S. Pat. No. 4,899,921 to Bendat et al, which is incorporated herein by reference. Such an aligner bonder tool is available from Research Devices of Piscataway, N.J.

In the present case an aligner bonder may be modified to provide a manual assembly apparatus 146 (FIG. 7) for use in assembling the carrier 90. The assembly wand 144 is a component of the manual assembly apparatus 146. The assembly wand 144 is associated with a clamp retainer mechanism 145 that is adapted to hold the bridge clamp 102 during the assembly process. The assembly wand 144 and retainer mechanism 145 are movable along the z-axis in either direction. The assembly apparatus 146 includes an optical probe 148 movable from one location to another to explore aligned portions of the die 92 and interconnect 96. In addition, the assembly apparatus 146 includes optics 154 and video cameras 150, 152 for providing video images of the opposing surfaces. These images are displayed on a display monitor 156.

The assembly apparatus 146 also includes an adjustable support 147 for supporting the carrier base 94. The adjustable support 147 is movable along x, y and z axes, in a rotational direction Θ (theta) and in angles of inclination Ø and Ψ. By moving the adjustable support 147 as required, the bond pads 120 on the die 92 can be aligned with the contact members 118 on the interconnect 96. In addition, by using reference marks, adjustment of angles of inclination ø and Ψ of the adjustable support 147 can be used to achieve parallelism of the surfaces of the die 92 and interconnect 96.

Following alignment of the die 92 and interconnect 96, the adjustable support 147 is adapted to move the carrier base 94 in the z axis towards the die 92 and pressure plate 98 to place the contact members 118 of the interconnect 96 into contact with the bond pads 120 of the die 92. The assembly wand 144 is also adapted to exert a contact force of a predetermined magnitude on the pressure plate 98 and die 92 so that the contact members 118 on the interconnect 96 penetrate the bond pads 120 on the die 92 to form an electrical connection that is low resistance and ohmic.

At the same time the die 92 is placed into contact with the interconnect 96, the bridge clamp 102 is attached to the carrier tray 95 and released by the clamp retainer mechanism 145. This secures the carrier base 94 to the carrier tray 95. In addition, this causes the spring clip 100 on the bridge clamp 102 to bias the die 92 and interconnect 96 together. The construction of the bridge clamp 102, spring clip 100 and pressure plate 98 is adapted to evenly distribute this biasing force over the die 92.

A certain biasing force is achieved by properly sizing the clamp 102 and spring clip 100. In addition, as previously stated, the assembly apparatus 146 is adapted to exert a predetermined initial force for establishing the electrical connection between the contact members 118 and bond pads 120. For the interconnect 96A formed with self limiting contact member 118A, the initial force and biasing force are selected such that only the raised projections 138 of the contact members 118A penetrate into the bond pad 120. This helps to minimize damage to the bond pad 120.

With the carrier 90 assembled, the carrier can be transported to a location suitable for testing (e.g., burn-in oven). External test circuitry (not shown) can then be attached to the external connectors 110 on the carrier base 94 to conduct signals through the bond wires 112, through the conductive traces 122 on the interconnect 96, through the contact members 118 on the interconnect 96, through the bond pads 120 on the die 92 and to the integrated circuitry of the die 120. One way of establishing an external connection between test circuitry and the external connectors 110 may be with a test socket (not shown).

Following testing, the carrier 90 is disassembled for removing the tested die 92. Disassembly is accomplished by disengaging the bridge clamp 102 from the carrier tray 95. At the same time a vacuum can be applied to the die 92 and pressure plate 98, substantially as previously described, to disengage the die 92 from the interconnect 96. As with the assembly process, the assembly wand 144 and clamp retainer mechanism 145 may be used to facilitate disassembly of the carrier 90.

Figure 8:
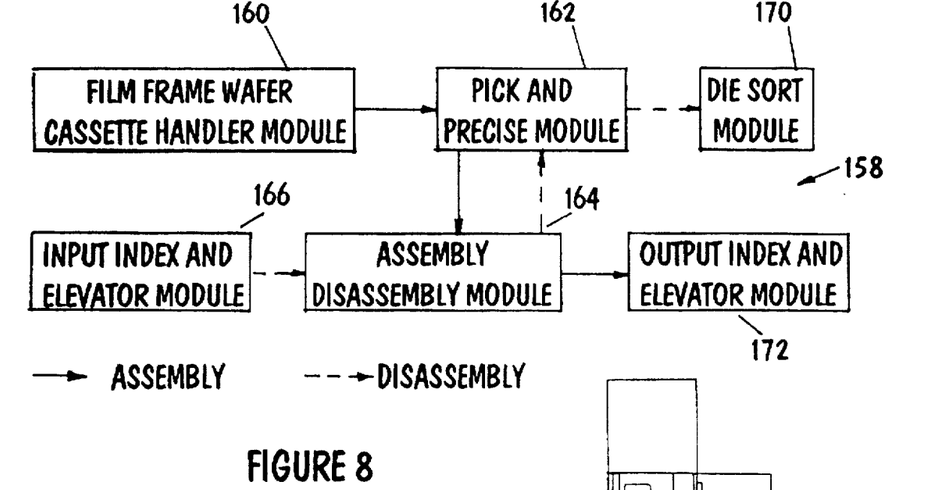
FIG. 8 is a block diagram illustrating a process flow for automatically assembling and disassembling the die and carrier.
Figure 9:
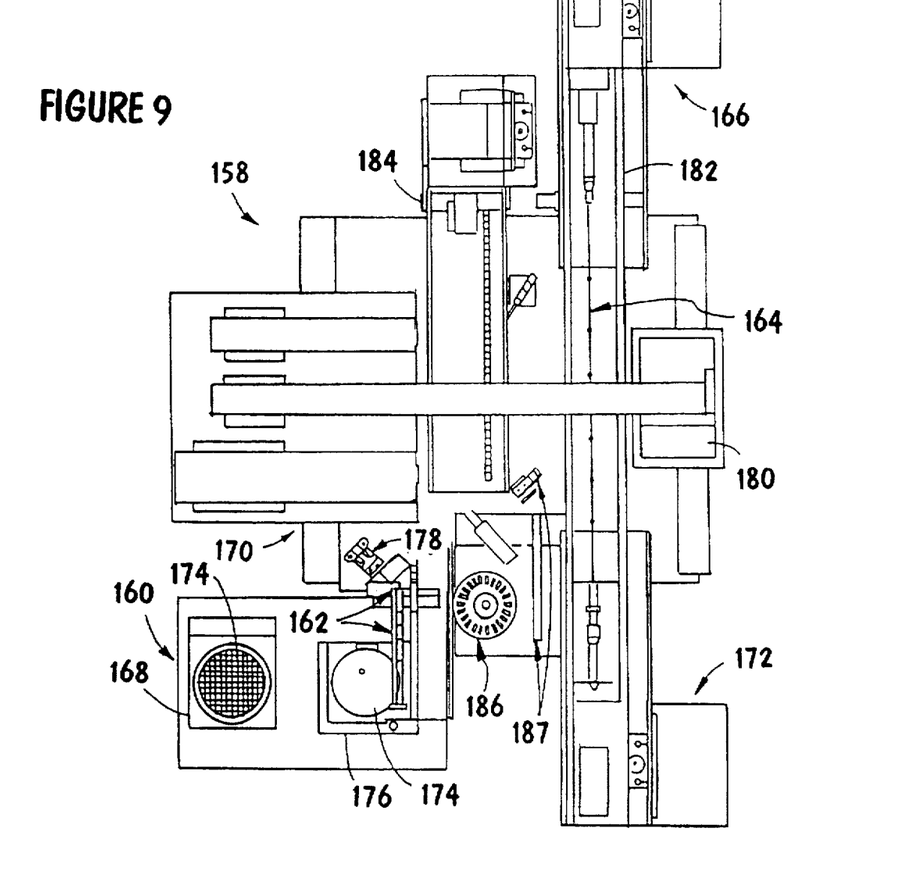
FIG. 9 is a schematic plan view of an assembly/disassembly apparatus suitable for use with the method of the invention.

Referring now to FIGS. 8 and 9, an automated assembly/disassembly apparatus 158 is shown. The automated assembly/disassembly apparatus 158 is adapted to pick a singulated die 92 from a sawed wafer and assemble the die 92 with a carrier 90 for testing. Following testing the apparatus 158 is adapted to disassemble the carrier 90 and sort the tested die 92. The assembly/disassembly apparatus 158 is constructed in modules including: a film frame wafer cassette handler module 160; a die pick and precise module 162; a die assembly/disassembly module 164; a pressure plate pick and precise module 187; an input index and elevator module 166; a die sort module 170; and an output index and elevator module 172.

The film frame wafer cassette handler module 160 is adapted to automatically load and handle sawed wafers that are mounted on an adhesive film. Prior to wafer sawing, during the wafer mapping process (step 66 FIG. 2), the dice have been tested at the wafer level for gross functionality. The dice that have an acceptable gross functionality are identified and the test results retained in software. The wafer cassette handler module 160 includes a magazine 168 for retaining multiple sawed wafers 174 and an associated expansion table 176 wherein a single wafer is held for die pick.

The die pick and precise module 162 is adapted to pick the dice one at a time from the sawed wafer. The die pick and precise module 162 includes an inverter arm 178 for inverting the die 90 so that it can be mounted face down on the interconnect 96. The inverter arm 178 uses a vacuum to aid in handling the die.

The die assembly/disassembly module 164 is adapted to take the inverted die and assemble the carrier 90 and die 92. The assembly/disassembly module 164 includes a robot 180 having a vision system and an assembly mechanism which are adapted to automatically perform the alignment and assembly functions shown in FIG. 7.

A carrier tray handler 182 is included in the assembly/disassembly module 164 for automatically moving and indexing the carrier bases 94 and carrier trays 95 during the assembly process. The carrier tray handler 182 is also operatively associated with the output index and elevator module 172 which handles the assembled carriers 90. The assembly/disassembly module 164 also includes a bridge clamp tray 184 for retaining a supply of bridge clamps 102 (FIG. 3A) and a pressure plate carousel 186 for retaining a supply of pressure plates 98 (FIG. 3A) for the assembly process.

An assembly sequence using the automated assembly/disassembly apparatus 158 is as follows:

1. A die 92 is picked from the expansion table 176 as determined by wafer map or other selection system such as ink dot recognition.
2. The inverter arm 178 picks up the die 92, then inverts the die 92 and places it in a die holder.
3. The robot 180 picks a bridge clamp 102 from the bridge clamp tray 184.
4. The robot 180 picks a pressure plate 98 from a precisor block contained in the pressure plate pick and precise module 187.
5. The vision system verifies the rough die location.
6. The robot 180 picks up the die 92 from the die holder.
7. The robot 180 moves to a vision location to ascertain the fine die location.
8. A carrier tray 95 marked with a bar code and assembled with a carrier base 94 and interconnect 96 is indexed into position for assembly by the carrier tray handler 182.
9. The robot 180 moves a height sensor over the carrier base 94 and determines the elevation of the interconnect 96.
10. The vision system determines the rough interconnect 96 location.
11. The vision system determines the fine interconnect 96 location.
12. The robot 180 corrects the die orientation in x-ytheta directions then moves downward along the z-axis, causing the die 92 to contact the interconnect 96. At the same time the robot 180 applies a measured force to the die for establishing an electrical connection between the contact members 118 and bond pads 120. Also at the same time, the robot 180 places the bridge clamp 102 into engagement with the carrier tray 95 completing the carrier assembly. The bridge clamp 102 and spring clip 100 then maintain and evenly distribute a preset biasing force on the die 92 and interconnect 96.
13. The assembled carrier 90 is transported to a testing location for performing burn-in testing on the die 92. The assembled carrier 90 is marked with a bar code so that each die can be tracked and information on the tested die recorded.

Following the test procedure the assembly/disassembly apparatus 158 is adapted to disassemble the carrier 90 and tested die 92. For the disassembly procedure the apparatus 158 includes an input index and elevator module 166 for loading the tested assembled carriers onto the carrier tray handler 182 and a die sort module 170 for sorting the tested dice into trays.

During the disassembly procedure the following process sequence occurs.

1. The assembled carrier 90 is indexed and held in position on the carrier tray handler 182. The robot 180 determines the location of the assembled carrier 90 using the vision system. The robot 180 moves down and applies a constraining force to the bridge clamp 102 and disengages the bridge clamp 102 from the retainer slots 108 on the carrier tray 95. Simultaneously, the robot 180 applies a vacuum force to the pressure plate 98 and die 92. The robot 180 is then moved upward, disengaging the die 92 from the interconnect 96.
2. The robot 180 then places the die 92 on an inverting station arm for inverting.
3. The die 92 is inverted and placed on a precisor block and precised.
4. The robot 180 then picks up the die 92 with an auxiliary quill and places the die 92 into an output pack. The output pack may be a tray, waffle pack, Gel-Pac, or tape and reel carrier.
5. The pressure plate 98 is placed on the pressure plate assembly, precised and then placed back in the pressure plate carousel 186.
6. The bridge clamp 102 is then placed back in the bridge clamp tray handler 184.

In addition to performing the functions outlined above, the assembly/disassembly apparatus 158 may include computer hardware and software capable of monitoring, controlling and collecting process data including contact force versus time, machine vision parameters and electrical continuity between die 92 and interconnect 96. This data collection capability in addition to allowing process monitoring, permits real-time traceability of devices. This permits faster internal process feedback specific to device performance to be generated without introducing final packaging process variations.

Thus the invention provides a method and apparatus for producing known good die (KGD). While the invention has been described with reference to certain preferred embodiments, as will be apparent to those skilled in the art, certain changes and modifications can be made without departing from the scope of the invention as defined by the following claims.

What is claimed is:

1. An apparatus for manufacturing a semiconductor die comprising:
    a carrier for retaining the die for testing, the carrier including an interconnect comprising a contact member for establishing temporary electrical communication with a contact location on the die and a force distribution mechanism for biasing the die against the interconnect;
    an optical probe for viewing the contact member on the interconnect and the contact location on the die;
    a support member for supporting the carrier;
    an assembly member for placing the die in contact with the interconnect and for attaching the force distribution mechanism to the carrier;
    the support member, or the assembly member, configured to align the contact member and the contact location with input from the optical probe, and to maintain alignment as the force distribution mechanism is attached to the carrier.

2. The apparatus as claimed in claim 1 wherein the assembly member comprises a vacuum conduit for holding the die and a mechanism for attaching the force distribution mechanism to the carrier.

3. The apparatus as claimed in claim 1 wherein the support member or the assembly member is movable along x, y and z axes, and is movable in a rotational direction.

4. The apparatus as claimed in claim 1 wherein the contact member comprises a raised member formed on a substrate and covered with a conductive layer.

5. The apparatus as claimed in claim 1 wherein the contact member comprises a metal bump on an electrically insulating tape.

6. An apparatus for manufacturing a semiconductor die comprising:
    a carrier for retaining the die for testing, the carrier including an interconnect comprising a contact member configured to establish temporary electrical communication with a contact location on the die and a force distribution mechanism for biasing the die against the interconnect;
    an assembly member configured to place the die on the interconnect and to attach the force distribution mechanism to the carrier;
    a support member configured to support the carrier, the support member or the assembly member movable along x, y, and z axes, and along a rotational axis; and
    an optical probe configured to view the contact member on the interconnect and to simultaneously view the contact location on the die to provide input for moving the support member or the assembly member to align and place the contact member in electrical communication with the contact location as the force distribution mechanism is attached to the carrier.

7. The apparatus as claimed in claim 6 wherein the force distribution mechanism comprises a spring, a pressure plate and a clamp.

8. The apparatus as claimed in claim 7 wherein the assembly member comprises a vacuum wand.

9. An apparatus for manufacturing a semiconductor die comprising:
    a carrier comprising a base for retaining the die for testing, a contact member for electrically contacting a contact location on the die, and a spring for biasing the die against the contact member;
    an assembly member comprising a robot with a vacuum conduit for holding the die and the spring, the robot configured to alian and place the contact member in electrical contact with the contact location, and to attach the spring to the base;
    a support member configured to support the base; and
    an optical probe configured to view the contact member and the contact location to provide input for moving the robot to place the contact member and the contact location in electrical contact, and to attach the spring to the base.

10. The apparatus as claimed in claim 9 wherein the carrier further comprises a clamp member attached to the spring for attaching the spring to the base.

11. The apparatus as claimed in claim 9 wherein the assembly member comprises a die holder configured to hold a plurality of singulated dice.

12. An apparatus for manufacturing a semiconductor die comprising:
    a carrier for retaining the die for testing, the carrier comprising a base and an interconnect with a plurality of contact members for making temporary electrical connections with contact locations on the die and a force distribution mechanism for biasing the die against the interconnect;
    an optical probe configured to view the contact members and the contact locations; and
    a carrier assembly mechanism configured to assemble the carrier by placing the die on the interconnect and by attaching the force distribution mechanism to the base, the carrier assembly mechanism comprising a vacuum member configured to pick and place the die on the carrier responsive to input from the optical probe, a retainer mechanism configured to attach the force distribution mechanism to the base, and a support mechanism configured to support the carrier, with either the vacuum member or the support mechanism movable responsive to input from the optical probe to align the contact members on the carrier and the contact locations on the die.

13. The apparatus as claimed in claim 12 wherein the force distribution mechanism comprises a spring and a bridge clamp.

14. The apparatus as claimed in claim 12 wherein the vacuum member is movable along x, y and z axes, and is movable in a rotational direction.

15. The apparatus as claimed in claim 12 wherein the support member is movable along x, y and z axes, and is movable in a rotational direction.

16. An apparatus for manufacturing a semiconductor die comprising:
    a carrier for retaining the die for testing, the carrier comprising a base, a contact member on the base for electrically contacting a contact location on the die, and a clamp and spring attachable to the base for biasing the die against the contact member;
    a carrier handler for holding a plurality of carriers;
    a die holder for holding a plurality of dice;

a tray for holding a plurality of clamps and springs;

a robot configured to pick the die from the die holder, to pick the carrier from the carrier handler, to pick the clamp and spring from the tray, to align the contact location on the die with the contact member on the base, to place the die on the contact member, and to attach the clamp to the base with the spring biasing the die against the contact member; and an optical probe configured to view the contact location on the die, and the contact member on the carrier; and to provide input for controlling the robot to align the contact location and the contact member.

17. The apparatus as claimed in claim 16 wherein the robot comprises a vacuum conduit for holding die and a mechanism for holding the clamp.

18. The apparatus as claimed in claim 16 wherein the robot is configured to disassemble the carrier by removing the clamp and spring from the base and the die from the contact member.

* * * * *

UNITED STATES PATENT AND TRADEMARK OFFICE
CERTIFICATE OF CORRECTION

PATENT NO. : 5,796,264
DATED : Aug. 18, 1998
INVENTOR(S) : Warren Farnworth
Alan Wood It is certified that error appears in the above-identified patent and that said Letters Patent is hereby corrected as shown below:

In column 16, line 12, change "alian" to --align--.

Signed and Sealed this

Seventeenth Day of November, 1998

Attest:

BRUCE LEHMAN

Attesting Officer          Commissioner of Patents and Trademarks